(12) United States Patent
Lee et al.

(10) Patent No.: US 7,564,042 B2
(45) Date of Patent: Jul. 21, 2009

(54) ION BEAM APPARATUS HAVING PLASMA SHEATH CONTROLLER

(75) Inventors: Do-Haing Lee, Gyeonggi-do (KR); Sung-Wook Hwang, Seoul (KR); Chul-Ho Shin, Gyeonggi-do (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 163 days.

(21) Appl. No.: 11/834,561

(22) Filed: Aug. 6, 2007

(65) Prior Publication Data

US 2008/0179546 A1 Jul. 31, 2008

(30) Foreign Application Priority Data

Jan. 30, 2007  (KR) .................. 10-2007-0009476

(51) Int. Cl.
*H05H 1/02* (2006.01)
*H01J 3/14* (2006.01)
*H01J 37/08* (2006.01)

(52) U.S. Cl. .............. 250/396 R; 250/492.2; 250/492.21; 250/423 R; 313/360.1; 313/361.1; 313/363.1; 315/111.21; 315/111.31

(58) Field of Classification Search ............ 250/396 R, 250/492.2, 492, 21; 313/360.1, 361.1, 363.1; 315/111.21, 111.31
See application file for complete search history.

(56) References Cited

U.S. PATENT DOCUMENTS

| 4,450,031 | A | 5/1984 | Ono et al. |
| 6,346,768 | B1 * | 2/2002 | Proudfoot ............... 313/359.1 |
| 6,759,807 | B2 * | 7/2004 | Wahlin ................. 315/111.21 |
| 7,045,793 | B2 * | 5/2006 | Wahlin ................... 250/396 R |
| 2007/0181820 | A1 * | 8/2007 | Hwang et al. ........... 250/396 R |
| 2008/0132046 | A1 * | 6/2008 | Walther ..................... 438/513 |
| 2008/0164819 | A1 * | 7/2008 | Hwang et al. ........... 315/111.41 |

FOREIGN PATENT DOCUMENTS

JP        04-180621        6/1992

(Continued)

OTHER PUBLICATIONS

English language abstract of Japanese Publication No. 04-180621.

(Continued)

*Primary Examiner*—Nikita Wells
(74) *Attorney, Agent, or Firm*—Marger Johson & McCollom, P.C.

(57) ABSTRACT

An ion beam apparatus includes a plasma chamber with a grid assembly installed at one end of the plasma chamber and a plasma sheath controller disposed between the plasma chamber and the grid assembly. The grid assembly includes first ion extraction apertures. The plasma sheath controller includes second ion extraction apertures smaller than the first ion extraction apertures. When the plasma sheath controller is used in this configuration, the surface of the plasma takes on a more planar configuration adjacent the controller so that ions, extracted from the plasma in a perpendicular direction to the plasma surface, pass cleanly through the apertures of the grid assembly rather than collide with the sidewalls of the grid assembly apertures. A semiconductor manufacturing apparatus and method for forming an ion beam are also provided.

28 Claims, 9 Drawing Sheets

FOREIGN PATENT DOCUMENTS

| | | |
|---|---|---|
| JP | 04-225226 | 8/1992 |
| JP | 11-154482 | 6/1999 |
| KR | 2000-0002271 | 1/2000 |
| KR | 2000-0053175 | 8/2000 |
| KR | 10-2005-0087586 | 8/2005 |

OTHER PUBLICATIONS

English language abstract of Korean Publication No. 2000-0002271.
English language abstract of Korean Publication No. 10-2005-0087586.

* cited by examiner

ION BEAM APPARATUS HAVING PLASMA SHEATH CONTROLLER

CROSS-REFERENCE TO RELATED APPLICATION

This application claims the benefit of Korean Patent Application No. 10-2007-0009476, filed Jan. 30, 2007, the disclosure of which is hereby incorporated herein by reference in its entirety.

BACKGROUND OF THE INVENTION

1. Field of the Invention

The present invention relates to an apparatus using plasma, and more particularly, to an ion beam apparatus having a plasma sheath controller and a semiconductor surface treatment apparatus employing the same.

2. Description of the Related Art

Semiconductor manufacturing apparatuses using plasma are widely used, for example, a plasma etcher, a plasma enhanced chemical vapor deposition (PECVD) apparatus, a surface treatment apparatus for metal or polymer, a synthesizing apparatus for new materials, an adhesion apparatus for different thin films, and so on. The semiconductor manufacturing apparatuses using plasma may include an ion beam apparatus.

Figure 1:
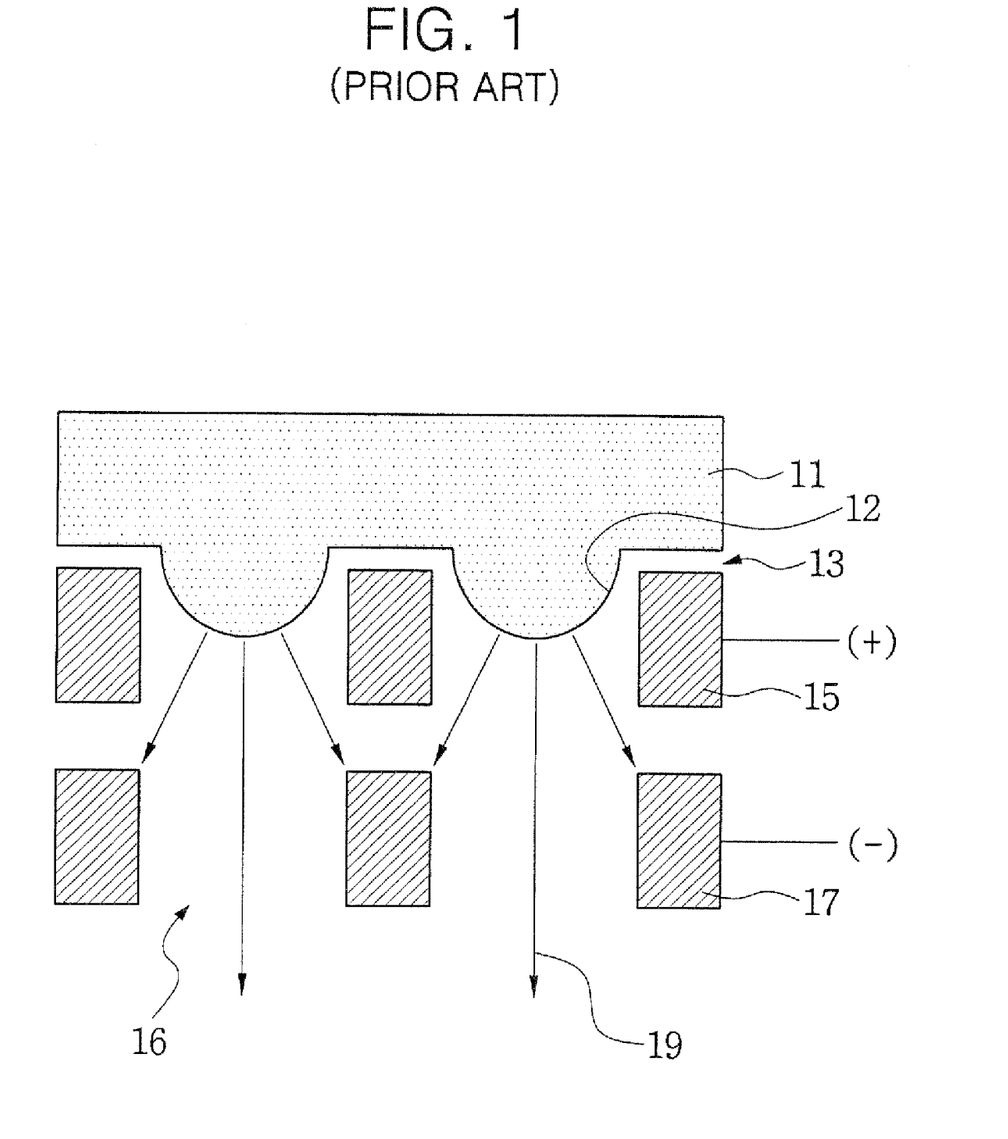
FIG. 1 is a partial cross-sectional view of a conventional ion beam apparatus.

FIG. 1 is a partial cross-sectional view of a conventional ion beam apparatus.

Referring to FIG. 1, the conventional ion beam apparatus includes first and second ion extraction grids 15 and 17 disposed at one surface of a plasma chamber (not shown). The ion extraction grids 15 and 17 have aligned ion extraction apertures 16. A positive voltage is applied to the first ion extraction grid 15. A negative voltage is applied to the second ion extraction grid 17. The second ion extraction grid 17 may be grounded.

The plasma chamber functions to generate plasma 11. Generally, a plasma sheath 13 is formed between the plasma 11 and an object opposite thereto. In this case, a plasma surface 12 exists at a position spaced apart from the opposite object by a thickness of the plasma sheath 13. Therefore, the plasma sheath 13 is formed between the plasma 11 and the first ion extraction grid 15.

The ion extraction grids 15 and 17 extract ions from the plasma 11 to discharge the ions via the ion extraction apertures 16. The extracted ions are accelerated in the form of an ion beam 19 while the ions pass through the ion extraction apertures 16.

Generally, an increase in density of the plasma 11 or expansion of the ion extraction apertures 16 is advantageous to an increase of ion flux of the ion beam 19. When the ion extraction apertures 16 have a diameter much smaller than the thickness of the plasma sheath 13, the plasma surface 12 is formed parallel to a surface of the first ion extraction grid 15. However, the higher the density of the plasma 11, the smaller the thickness of the plasma sheath 13.

Further, when the density of the plasma 11 is increased more, the plasma sheath 13 is formed along the ion extraction apertures 16. That is, the plasma 11 bows outward into the ion extraction apertures 16. In this case, the plasma surface 12 assumes a periodic curved/spherical form into the ion beam pathways through the ion extraction apertures 16.

The disadvantage of this deformation of the plasma surface is that the ions in the plasma 11 are extracted in a direction perpendicular to the plasma surface 12. Therefore, the ions extracted from the curved plasma surface 12 collide with the ion extraction grids 15 and 17. As a result, the ion flux of the ion beam 19 is somewhat reduced. This detrimental effect becomes even more pronounced as the density of the plasma 11 (e.g. the energy supplied to the plasma) is increased. It therefore becomes impossible to obtain high ion flux of the ion beam 19.

Semiconductor manufacturing apparatus using plasma is disclosed in U.S. Pat. No. 4,450,031, entitled "Ion Shower Apparatus," filed by Ono, et al. According to Ono, et al., an ion shower apparatus including a shield grid and an ion extraction grid is provided. However, an ion beam apparatus capable of increasing ion flux is still required.

Accordingly, the need remains for methods of improving the ion flux of an ion beam.

SUMMARY OF THE INVENTION

An embodiment of the invention provides an ion beam apparatus with high ion flux.

Another embodiment of the invention provides a semiconductor manufacturing apparatus using an ion beam apparatus with high ion flux.

Still another embodiment of the invention provides a method for producing an ion beam with a high ion flux.

In one aspect, the invention is directed to an ion beam apparatus having a plasma sheath controller. The apparatus includes a plasma chamber. A grid assembly is installed at one end of the plasma chamber. The grid assembly includes first ion extraction apertures. The plasma sheath controller is disposed between the plasma chamber and the grid assembly. The plasma sheath controller includes second ion extraction apertures smaller than the first ion extraction apertures.

In some embodiments of the present invention, the second ion extraction aperture may have a width smaller than the thickness of a plasma sheath of the plasma chamber.

In other embodiments, the plasma sheath controller may be in contact with the grid assembly. In addition, the plasma sheath controller may be a conductor.

In still other embodiments, the plasma sheath controller may be a net grid or a porous material layer. In this case, the plasma sheath controller may be formed of one selected from the group consisting of graphite, metal, and carbon nano tubes.

In yet other embodiments, the grid assembly may include a first ion extraction grid and a second ion extraction grid. In this case, the first ion extraction grid may be interposed between the plasma sheath controller and the second ion extraction grid. In addition, the plasma sheath controller may be thinner than the first ion extraction grid. A positive voltage may be applied to the first ion extraction grid. A negative voltage may be applied to the second ion extraction grid, and the second ion extraction grid may be grounded.

In yet other embodiments, the grid assembly may include the first ion extraction grid, the second ion extraction grid, and a third ion extraction grid. In this case, the second ion extraction grid may be interposed between the first ion extraction grid and the third ion extraction grid. In addition, a positive voltage may be applied to the third ion extraction grid.

In another aspect, the present invention is also directed to a semiconductor manufacturing apparatus having a plasma sheath controller. The manufacturing apparatus includes a plasma chamber. A specimen chamber in communication with the plasma chamber is provided. A grid assembly is disposed between the plasma chamber and the specimen chamber. The grid assembly includes first ion extraction apertures. The plasma sheath controller is disposed between the plasma chamber and the grid assembly. The plasma sheath controller includes second ion extraction apertures smaller than the first ion extraction apertures.

In some embodiments, a gas inlet port may be disposed at one surface of the plasma chamber. In addition, an exhaust port may be disposed in the specimen chamber. A wafer stage may be disposed in the specimen chamber.

In other embodiments, the second ion extraction apertures may have a width smaller than the thickness of a plasma sheath of the plasma chamber.

In yet another aspect, the present invention is also directed to a method for providing an ion beam from a plasma source. The method comprises positioning a plasma sheath controller adjacent the plasma sheath of a plasma source and in front of a grid assembly so that multiple apertures of the plasma sheath controller are in communication with each aperture of the grid assembly and the resulting plasma sheath is substantially coplanar with a surface of the plasma sheath controller. A voltage is applied to the grid assembly. Ions are extracted through apertures in the plasma sheath controller and then through apertures in the grid assembly to form an ion beam.

Where a first extraction grid of the grid assembly and a second extraction grid, aligned with the first, are provided, the method further comprises applying the voltage to the first extraction grid and a different voltage to the second extraction grid.

BRIEF DESCRIPTION OF THE DRAWINGS

The foregoing and other objects, features and advantages of the invention will become more apparent from the following more particular description of exemplary embodiments of the invention and the accompanying drawings. The drawings are not necessarily to scale, emphasis instead being placed upon illustrating the principles of the invention.

DETAILED DESCRIPTION OF THE INVENTION

The present invention is described more fully hereinafter with reference to the accompanying drawings, in which embodiments of the present invention are shown. This invention may, however, be embodied in many different forms and should not be construed as limited to the embodiments set forth herein. Rather, these embodiments are provided so that this disclosure will be thorough and complete, and will fully convey the scope of the present invention to those skilled in the art. In the drawings, the sizes and relative sizes of layers and regions may be exaggerated for clarity. Like numbers refer to like elements throughout.

Figure 2:
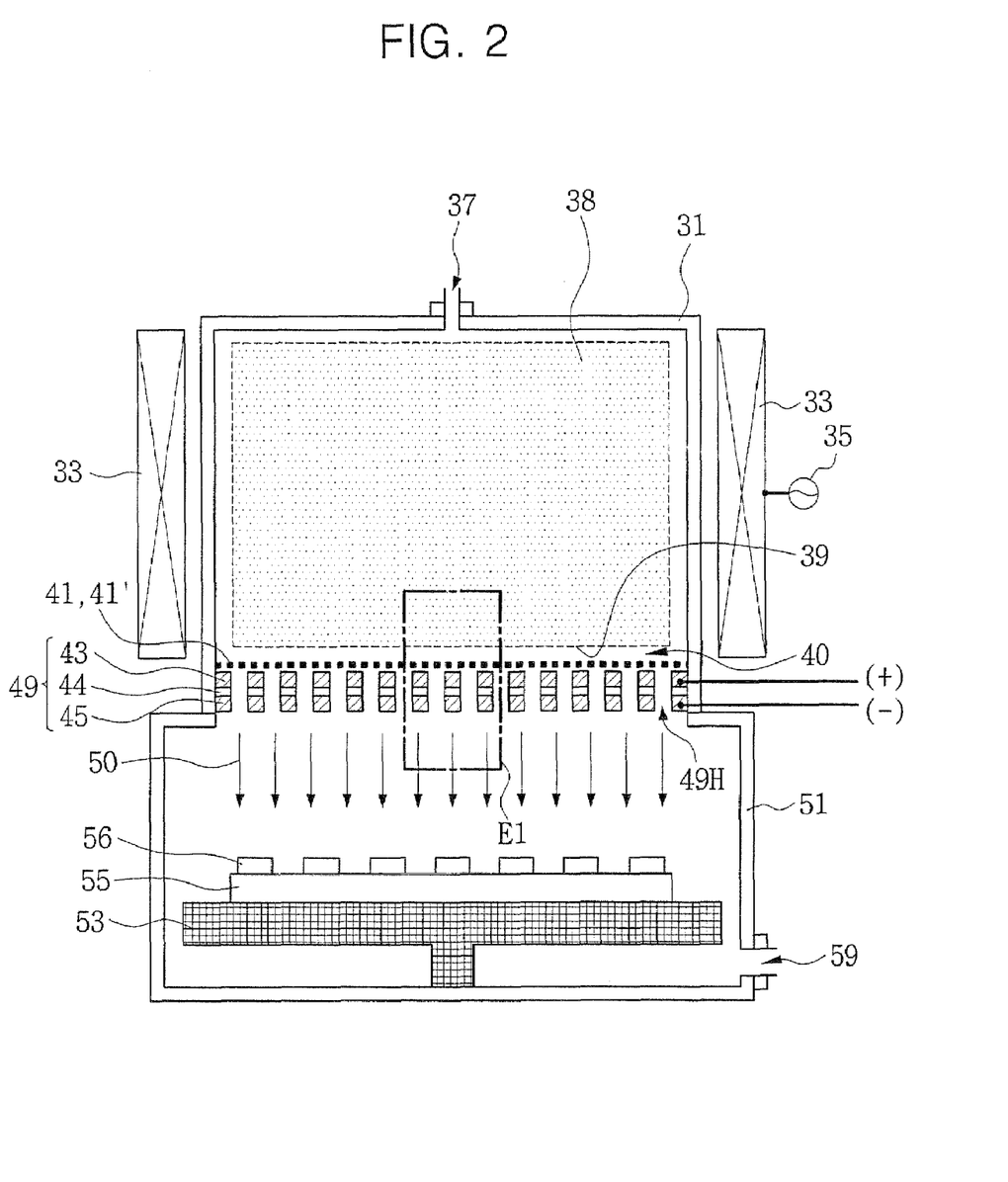
FIG. 2 is a cross-sectional view of a semiconductor surface treatment apparatus in accordance with exemplary embodiments of the present invention.

FIG. 2 is a cross-sectional view of a semiconductor surface treatment apparatus in accordance with exemplary embodiments of the present invention.

Referring to FIG. 2, a plasma chamber 31 and a specimen chamber 51 in communication with the plasma chamber 31 may be provided. A grid assembly 49 may be disposed between the plasma chamber 31 and the specimen chamber 51. A plasma sheath controller 41 or 41' may be disposed between the plasma chamber 31 and the grid assembly 49.

A gas inlet port 37 may be provided at one surface of the plasma chamber 31. A process gas may be injected into the plasma chamber 31 through the gas inlet port 37. The plasma chamber 31 may be surrounded by an induction coil 33. The induction coil 33 may be connected to a radio frequency (RF) power supply 35. The RF power supply 35 and the induction coil 33 may function to generate plasma 38 in the plasma chamber 31.

An exhaust port 59 may be provided at one side of the specimen chamber 51. The exhaust port 59 may be in communication with an exhaust apparatus such as a vacuum pump (not shown). Byproducts in the plasma chamber 31 and the specimen chamber 51 may be discharged through the exhaust port 59. The vacuum pump may function to maintain the interior of the plasma chamber 31 and the specimen chamber 51 at a low pressure.

A wafer stage 53 may be disposed in the specimen chamber 51. A wafer 55 may be mounted on the wafer stage 53. A mask pattern 56 may be provided on the wafer 55.

The grid assembly 49 may include a first ion extraction grid 43 and a second ion extraction grid 45. The first ion extraction grid 43 may be disposed between the plasma chamber 31 and the second ion extraction grid 45. The second ion extract grid 45 may be disposed between the first ion extraction grid 43 and the specimen chamber 51. An insulating member 44 may be interposed between the first ion extraction grid 43 and the second ion extraction grid 45. The first ion extraction grid 43 and the second ion extraction grid 45 may be conductors. The insulating member 44 may be an insulator such as an oxide layer or a nitride layer.

A positive voltage may be applied to the first ion extraction grid 43. In this case, the second ion extraction grid 45 may be grounded. In addition, a negative voltage may be applied to the second ion extraction grid 45.

Alternatively, a negative voltage may be applied to the first ion extraction grid 43. In this case, the second ion extraction grid 45 may be grounded. In addition, a positive voltage may be applied to the second ion extraction grid 45.

The grid assembly 49 may include first ion extraction apertures 49H. The first ion extraction apertures 49H may pass through the first ion extraction grid 43, the insulating member 44, and the second ion extraction grid 45. The first ion extraction apertures 49H may have a cylinder shape or a slit shape.

The plasma sheath controller 41 or 41' may be disposed between the plasma chamber 31 and the grid assembly 49. The plasma sheath controller 41 or 41' may be a conductor or an insulator. The plasma sheath controller 41 or 41' may include second ion extraction apertures smaller than the first ion extraction apertures 49H. The plasma sheath controller 41 or 41' may be thinner than the first ion extraction grid 43.

The plasma sheath controller 41 or 41' may be in contact with the first ion extraction grid 43. In this case, the plasma sheath controller 41 or 41' may have the same potential as the first ion extraction grid 43.

The plasma 38 may be generated in the plasma chamber 31. A plasma sheath 40 may exist between the plasma 38 and the plasma sheath controller 41 or 41'. The plasma sheath controller 41 or 41' may function to control formation of the plasma sheath 40. Therefore, a plasma surface 39 may be spaced apart from the plasma sheath controller 41 or 41' by the thickness of the plasma sheath 40.

The thickness of the plasma sheath 40 may vary depending on the density of the plasma 38. For example, when the density of the plasma 38 is increased, the thickness of the plasma sheath 40 may be decreased. The plasma surface 39 may be controlled by adjusting the size of the second ion extraction apertures. The second ion extraction apertures may have a width smaller than the thickness of the plasma sheath 40. When the second ion extraction apertures have a width smaller than the thickness of the plasma sheath 40, the plasma surface 39 may be substantially parallel to a surface of the plasma sheath controller 41 or 41'.

The grid assembly 49 may function to extract an ion beam 50 through the first ion extraction apertures 49H. The ion beam 50 may be injected onto a surface of the wafer 55.

As described above, the plasma surface 39 may be controlled parallel to the surface of the plasma sheath controller 41 or 41'. Generally, ions extracted from the plasma 38 may have a directionality perpendicular to the plasma surface 39. Therefore, it is possible to minimize collision of the ions extracted from the plasma 38 with the grid assembly 49 and scattering of the ions. Eventually, it is possible to remarkably increase ion flux of the ion beam 50 compared to the conventional art.

Figure 3:
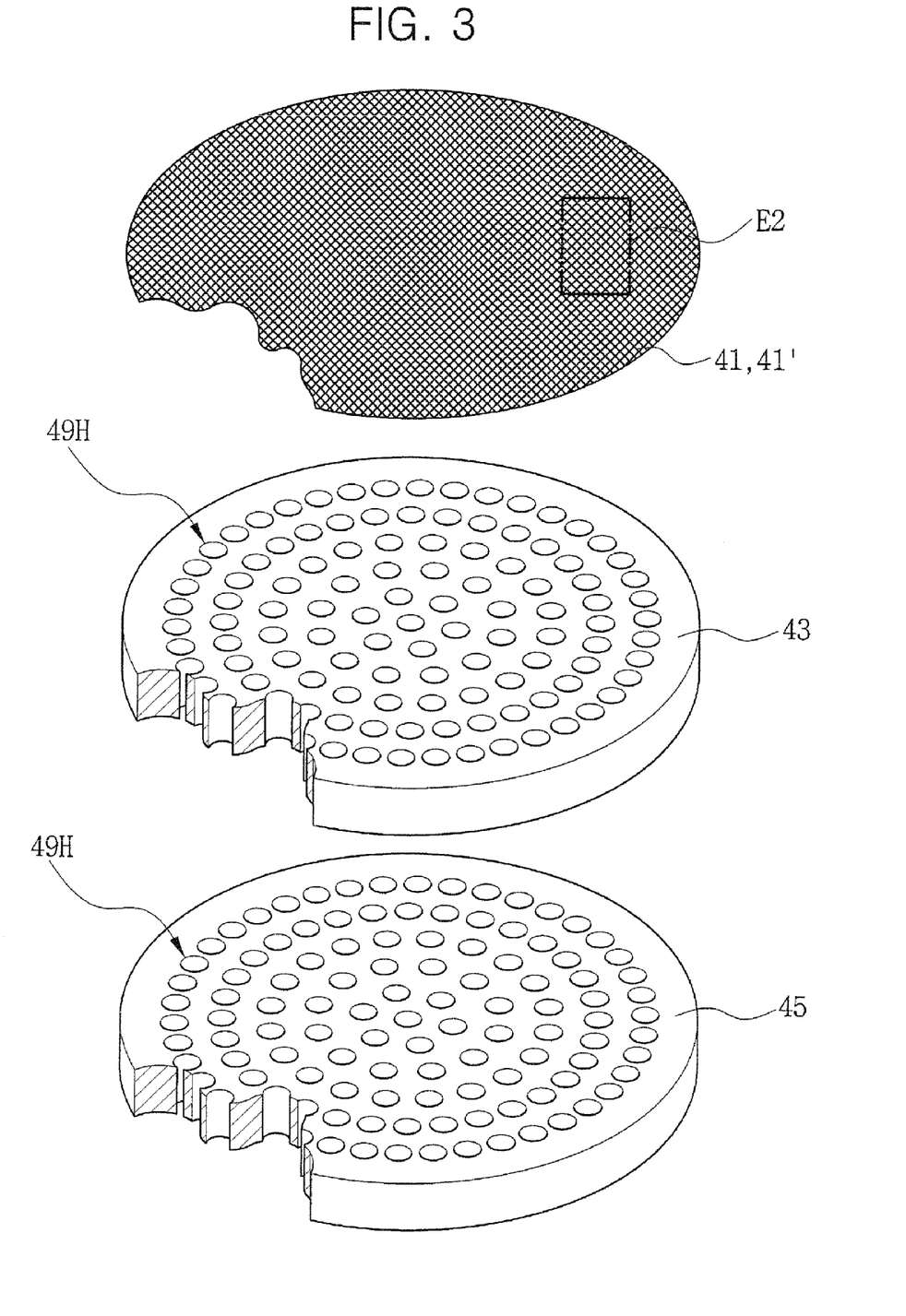
FIG. 3 is an enlarged perspective view of a plasma sheath controller and an ion extraction grid in accordance with exemplary embodiments of the present invention.
Figure 4:
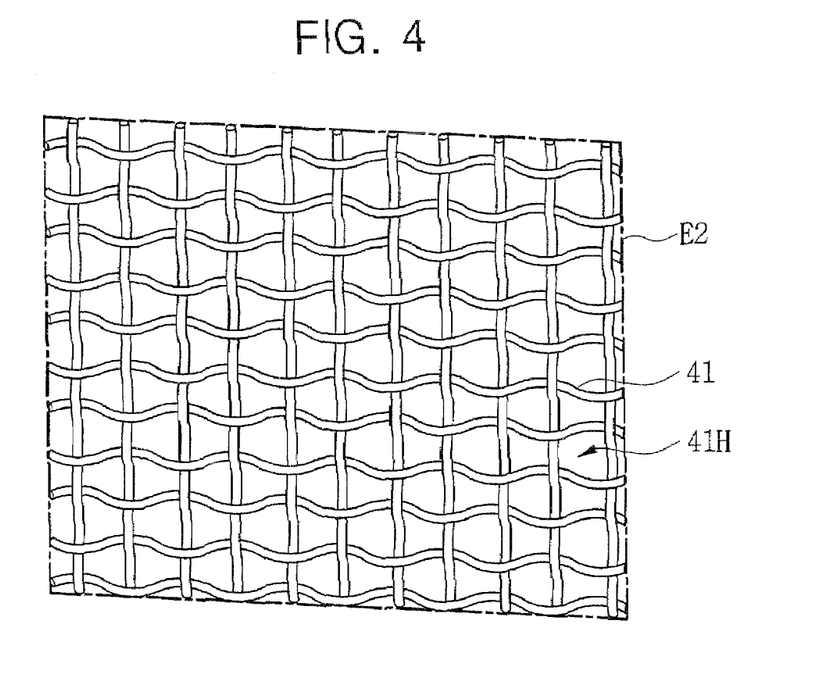
FIGS. 4 and 5 are enlarged perspective views of portion E2 of FIG. 3 according to alternate embodiments of the invention.
Figure 5:
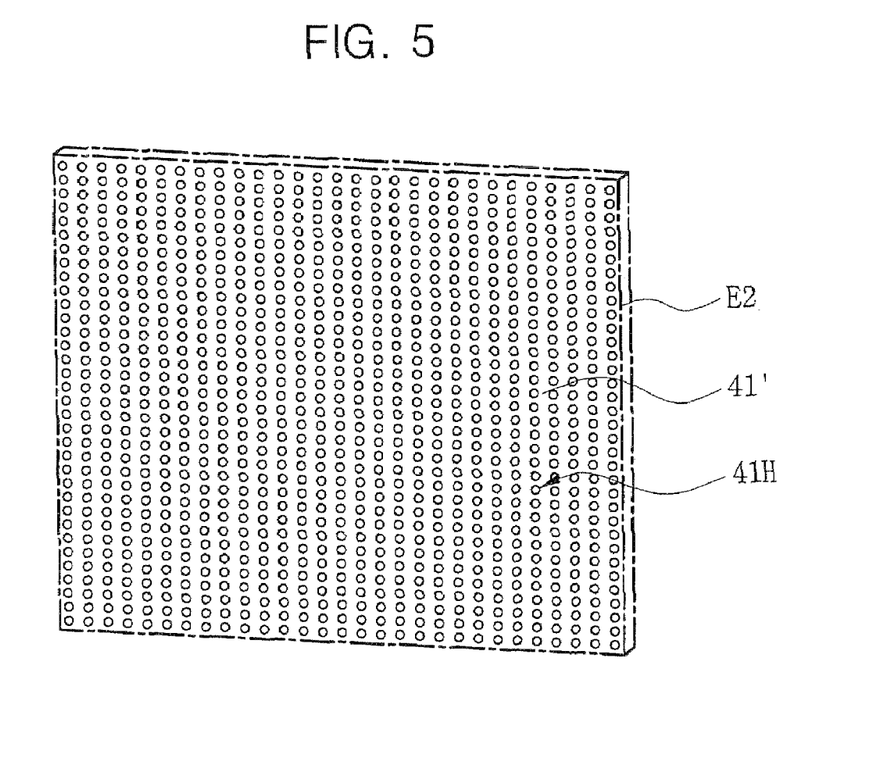

FIG. 3 is a perspective view of the plasma sheath controller 41 or 41' and the ion extraction grids 43 and 45 in accordance with exemplary embodiments of the present invention, and FIGS. 4 and 5 are enlarged perspective views of portion E2 of FIG. 3.

Referring to FIGS. 3, 4 and 5, the first ion extraction grid 43 may include the first ion extraction apertures 49H. The second ion extraction grid 45 may also include the first ion extraction apertures 49H. The first ion extraction grid 43 and the second ion extraction grid 45 may be aligned with reference to the first ion extraction apertures 49H.

As shown in the drawings, the first ion extraction apertures 49H may have a cylinder shape. On the other hand, the first ion extraction apertures 49H may have a slit shape. The first ion extraction grid 43 and the second ion extraction grid 45 may be conductors. The first ion extraction grid 43 and the second ion extraction grid 45 may have the same thickness or different thicknesses. For example, the second ion extraction grid 45 may be thicker than the first ion extraction grid 43.

The plasma sheath controller 41 or 41' may be a net grid 41 or a porous material layer 41'. The plasma sheath controller 41 or 41' may include second ion extraction apertures 41H. The second ion extraction apertures 41H may be smaller than the first ion extraction apertures 49H. The plasma sheath controller 41 or 41' may be thinner than the first ion extraction grid 43. The plasma sheath controller 41 or 41' may be a conductor or an insulator.

As shown in FIG. 4, the plasma sheath controller 41 or 41' may be a net grid 41. The net grid 41 may be formed of one selected from the group consisting of graphite, metal, and carbon nano tube. The net grid 41 may include the second ion extraction apertures 41H. The second ion extraction apertures 41H may be smaller than the first ion extraction apertures 49H. The net grid 41 may be thinner than the first ion extraction grid 43.

As shown in FIG. 5, the plasma sheath controller 41 or 41' may be a porous material layer 41'. In this case, the porous material layer 41' may be a conductor or an insulator. For example, the porous material layer 41' may be a porous metal layer or a porous ceramic layer. The porous material layer 41' may include the second ion extraction apertures 41H. The second ion extraction apertures 41H may be smaller than the first ion extraction apertures 49H. The porous material layer 41' may be thinner than the first ion extraction grid 43.

Figure 6:
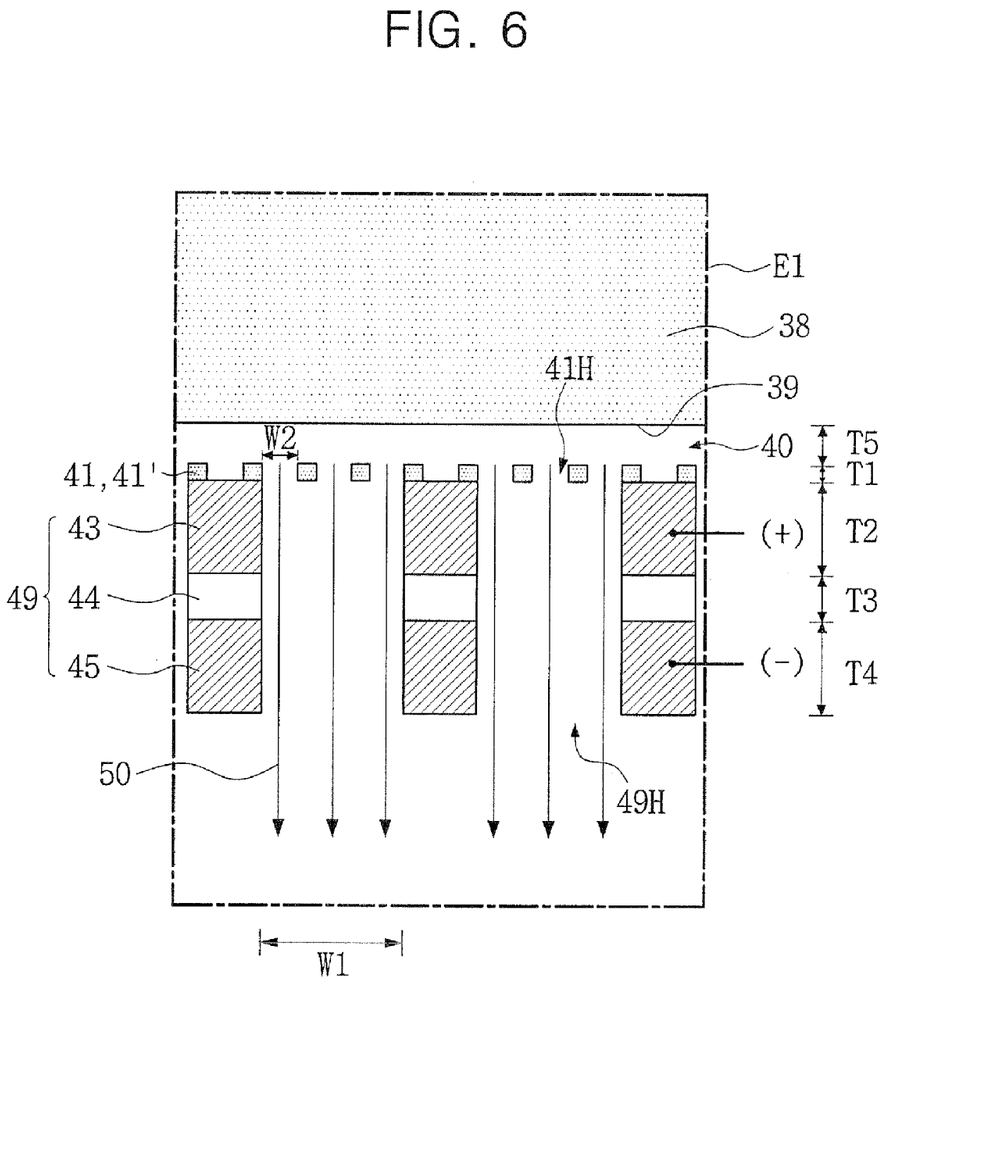
FIGS. 6 to 8 are enlarged cross-sectional views of portion E1 of FIG. 2 according to alternate embodiments of the invention.
Figure 7:
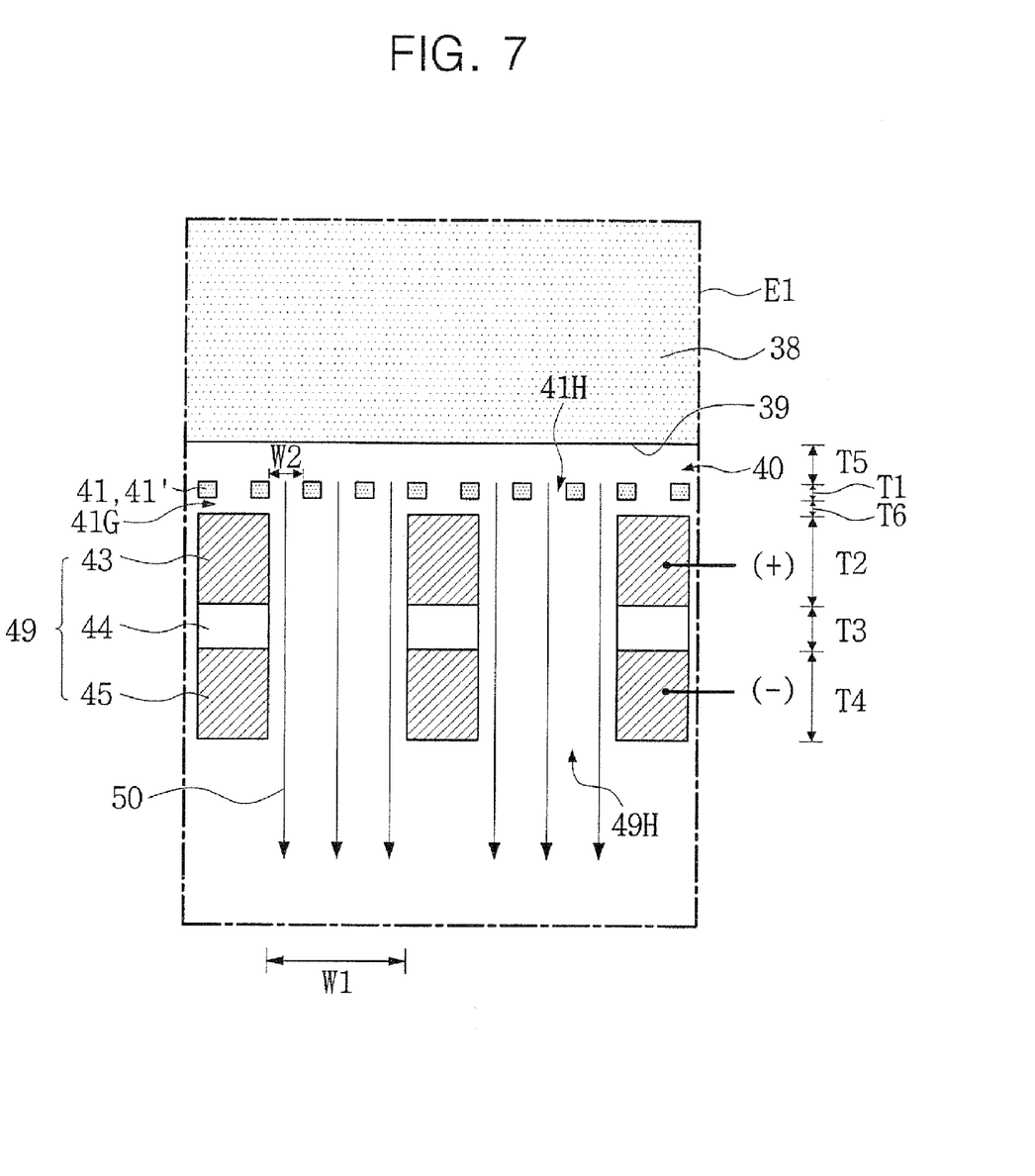
Figure 8:
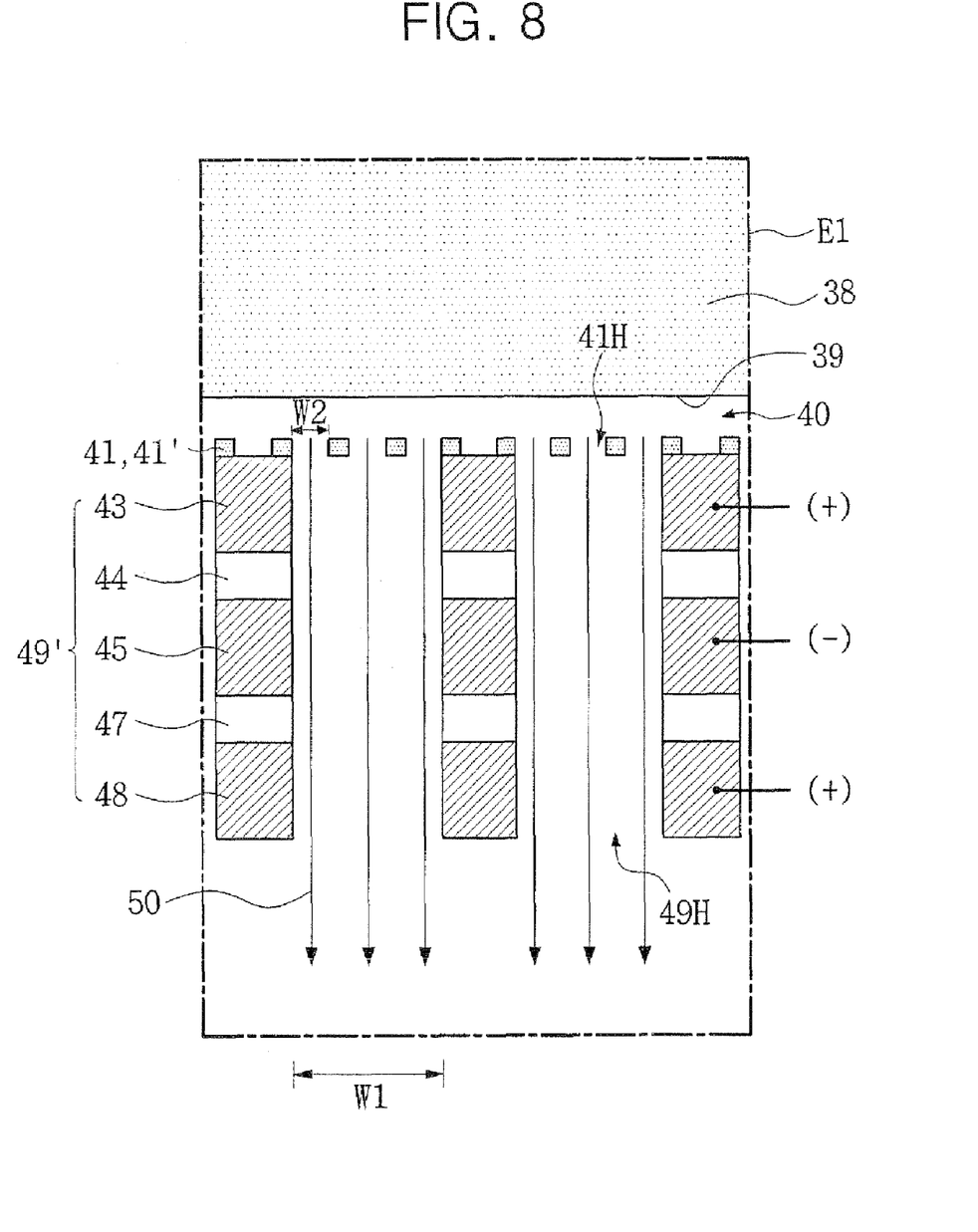

FIGS. 6 to 8 are enlarged cross-sectional views of portion E1 of FIG. 2.

Referring to FIGS. 2 and 6, the plasma sheath controller 41 or 41' may be attached to the grid assembly 49. The grid assembly 49 may include the first ion extraction grid 43, the insulating member 44, and the second ion extraction grid 45. In this case, the plasma sheath controller 41 or 41' may be in contact with the first ion extraction grid 43.

The plasma sheath controller 41 or 41' may have a first thickness T1. The first ion extraction grid 43 may have a second thickness T2. The insulating member 44 may have a third thickness T3. The second ion extraction grid 45 may have a fourth thickness T4. The first thickness T1 may be smaller than the second thickness T2. That is, the plasma sheath controller 41 or 41' may be thinner than the first ion extraction grid 43. The second thickness T2 and the fourth thickness T4 may be the same or different.

The grid assembly 49 may include the first ion extraction apertures 49H. The first ion extraction apertures 49H may pass through the first ion extraction grid 43, the insulating member 44 and the second ion extraction grid 45. The first ion extraction apertures 49H may have a first width W1.

The plasma sheath controller 41 or 41' may include the second ion extraction apertures 41H. The second ion extraction apertures 41H may have a second width W2. The second width W2 may be smaller than the first width W1. That is, the second ion extraction apertures 41H may be smaller than the first ion extraction apertures 49H. The plasma sheath controller 41 or 41' may be a conductor or an insulator.

The plasma sheath 40 may exist between the plasma 38 and the plasma sheath controller 41 or 41'. The plasma sheath 40 may have a fifth thickness T5. The fifth thickness T5 may vary depending on the density of the plasma 38. For example, the higher the density of the plasma 38, the thinner the fifth thickness T5. That is, a distance between the plasma surface 39 and the plasma sheath controller 41 or 41' is decreased as the density of the plasma 30 is increased.

The second width W2 may be smaller than the fifth thickness T5. That is, the second ion extraction apertures 41H may be smaller than the fifth thickness T5 of the plasma sheath 40. For example, the fifth thickness T5 may be several times larger than the second width W2. When the second width W2 is smaller than the fifth thickness T5, the plasma surface 39 may be parallel to the surface of the plasma sheath controller 41 or 41'. As described above, it is possible to control the plasma surface 39 by adjusting the size of the second ion extraction apertures 41H.

A positive voltage may be applied to the first ion extraction grid 43. In this case, the second ion extraction grid 45 may be grounded. In addition, a negative voltage may be applied to the second ion extraction grid 45. When the plasma sheath controller 41 or 41' is a conductor, the plasma sheath controller 41 or 41' may have the same potential as the first ion extraction grid 43.

The first ion extraction grid 43 and the second ion extraction grid 45 may function to extract the ion beam 50 from the plasma 38. The ion beam 50 sequentially passes through the second ion extraction apertures 41H and the first ion extraction apertures 49H to be injected into the specimen chamber 51.

Generally, ions extracted from the plasma 38 may have a directionality perpendicular to the plasma surface 39. As described above, in accordance with an exemplary embodiment of the present invention, it is possible to control the plasma surface 39 by adjusting the size of the second ion extraction apertures 41H. That is, though the density of the plasma 38 is increased, the plasma surface 39 may be formed parallel to the surface of the plasma sheath controller 41 or 41' opposite thereto. Therefore, it is possible to minimize collision of the ions extracted from the plasma 38 with the grid assembly 49 and scattering of the ions.

Eventually, it is possible to remarkably increase ion flux of the ion beam 50 compared to the conventional art by increasing the density of the plasma 38 and adjusting the size of the second ion extraction apertures 41H.

Referring to FIGS. 2 and 7, the plasma sheath controller 41 or 41' may be spaced apart from the grid assembly 49. The grid assembly 49 may include the first ion extraction grid 43, the insulating member 44, and the second ion extraction grid 45.

In this case, a gap region 41G may be provided between the plasma sheath controller 41 or 41' and the first ion extraction grid 43. The gap region 41G may be filled with an insulating material, but its description will be omitted for the sake of convenience. The gap region 41G may have a sixth thickness T6.

The grid assembly 49 may include the first ion extraction apertures 49H. The first ion extraction apertures 49H may have a first width W1. The plasma sheath controller 41 or 41' may include the second ion extraction apertures 41H. The second ion extraction apertures 41H may have a second width W2. The second width W2 may be smaller than the first width W1. That is, the second ion extraction apertures 41H may be smaller than the first ion extraction apertures 49H. The plasma sheath controller 41 or 41' may be a conductor or an insulator.

Generally, the plasma sheath 40 may exist between the plasma 38 and an object opposite thereto. That is, the plasma sheath 40 may exist between the plasma 38 and an insulator opposite to the plasma 38.

Therefore, the plasma sheath 40 may exist between the plasma 38 and the plasma sheath controller 41 or 41'. The plasma sheath 40 may have a fifth thickness T5. The fifth thickness T5 may vary depending on the density of the plasma 38. For example, the higher the density of the plasma 38, the thinner the fifth thickness T5.

The second width W2 may be smaller than the fifth thickness T5. That is, the second ion extraction apertures 41H may be smaller than the fifth thickness T5 of the plasma sheath 40. For example, the fifth thickness T5 may be several times larger than the second width W2. When the second width W2 is smaller than the fifth thickness T5, the plasma surface 39 may be formed parallel to the surface of the plasma sheath controller 41 or 41' opposite thereto.

The first ion extraction grid 43 and the second ion extraction grid 45 may function to extract the ion beam 50 from the plasma 38. The ion beam 50 sequentially passes through the second ion extraction apertures 41H and the first ion extraction apertures 49H to be injected into the specimen chamber 51.

Ions extracted from the plasma 38 may have a directionality perpendicular to the plasma surface 39. As described above, in accordance with an exemplary embodiment of the present invention, it is possible to control the plasma surface 39 by adjusting the size of the second ion extraction apertures 41H. That is, though the density of the plasma 38 is increased, the plasma surface 39 may be formed parallel to the surface of the plasma sheath controller 41 or 41' opposite thereto. Therefore, it is possible to minimize collision of the ions extracted from the plasma 38 with the grid assembly 49 and scattering of the ions.

Eventually, it is possible to remarkably increase ion flux of the ion beam 50 compared to the conventional art by increasing the density of the plasma 38 and adjusting the size of the second ion extraction apertures 41H.

Referring to FIGS. 2 and 8, another grid assembly 49' including the first ion extraction grid 43, the insulating member 44, the second ion extraction grid 45, another insulating member 47, and a third ion extraction grid 48 may be provided. The plasma sheath controller 41 or 41' may be attached to the grid assembly 49'. Hereinafter, only differences therebetween will be described in brief.

The third ion extraction grid 48 may be interposed between the second ion extraction grid 45 and the specimen chamber 51. In this case, the second ion extraction grid 45 may be interposed between the first ion extraction grid 43 and the third ion extraction grid 48. The other insulating layer 47 may be interposed between the second ion extraction grid 45 and the third ion extraction grid 48. The third ion extraction grid 48 may be a conductor.

The other grid assembly 49' may include the first ion extraction apertures 49H. The first ion extraction apertures 49H may pass through the first ion extraction grid 43, the insulating member 44, the second ion extraction grid 45, the other insulating member 47, and the third ion extraction grid 48. The first ion extraction apertures 49H may have a first width W1. The first ion extraction grid 43, the second ion extraction grid 45, and the third ion extraction grid 48 may be arranged with reference to the first ion extraction apertures 49H.

A voltage of the same polarity as the first ion extraction grid 43 may be applied to the third ion extraction grid 48. In addition, a voltage lower than the first ion extraction grid 43 may be applied to the third ion extraction grid 48. For example, when a first positive voltage is applied to the first ion extraction grid 43, a second positive voltage is applied to the third ion extraction grid 48, and the second voltage may be lower than the first voltage.

The first ion extraction grid 43, the second ion extraction grid 45, and the third ion extraction grid 48 may function to extract the ion beam 50 from the plasma 38. The ion beam 50 sequentially passes through the second ion extraction apertures 41H and the first ion extraction apertures 49H to be injected into the specimen chamber 51. Here, the third ion extraction grid 48 functions to control an acceleration speed of the ion beam 50 extracted through the first ion extraction apertures 49H.

Generally, the ions extracted from the plasma 38 may have a directionality perpendicular to the plasma surface 39. As described above, in accordance with an exemplary embodiment of the present invention, it is possible to control the plasma surface 39 by adjusting the size of the second ion extraction apertures 41H. That is, though the density of the plasma 38 is increased, the plasma surface 39 may be formed parallel to the surface of the plasma sheath controller 41 or 41' opposite thereto. Therefore, it is possible to minimize collision of the ions extracted from the plasma 38 with the grid assembly 49' and scattering of the ions.

Eventually, it is possible to remarkably increase ion flux of the ion beam 50 compared to the conventional art by increasing the density of the plasma 38 and adjusting the size of the second ion extraction apertures 41H.

EXAMPLE

Figure 9:
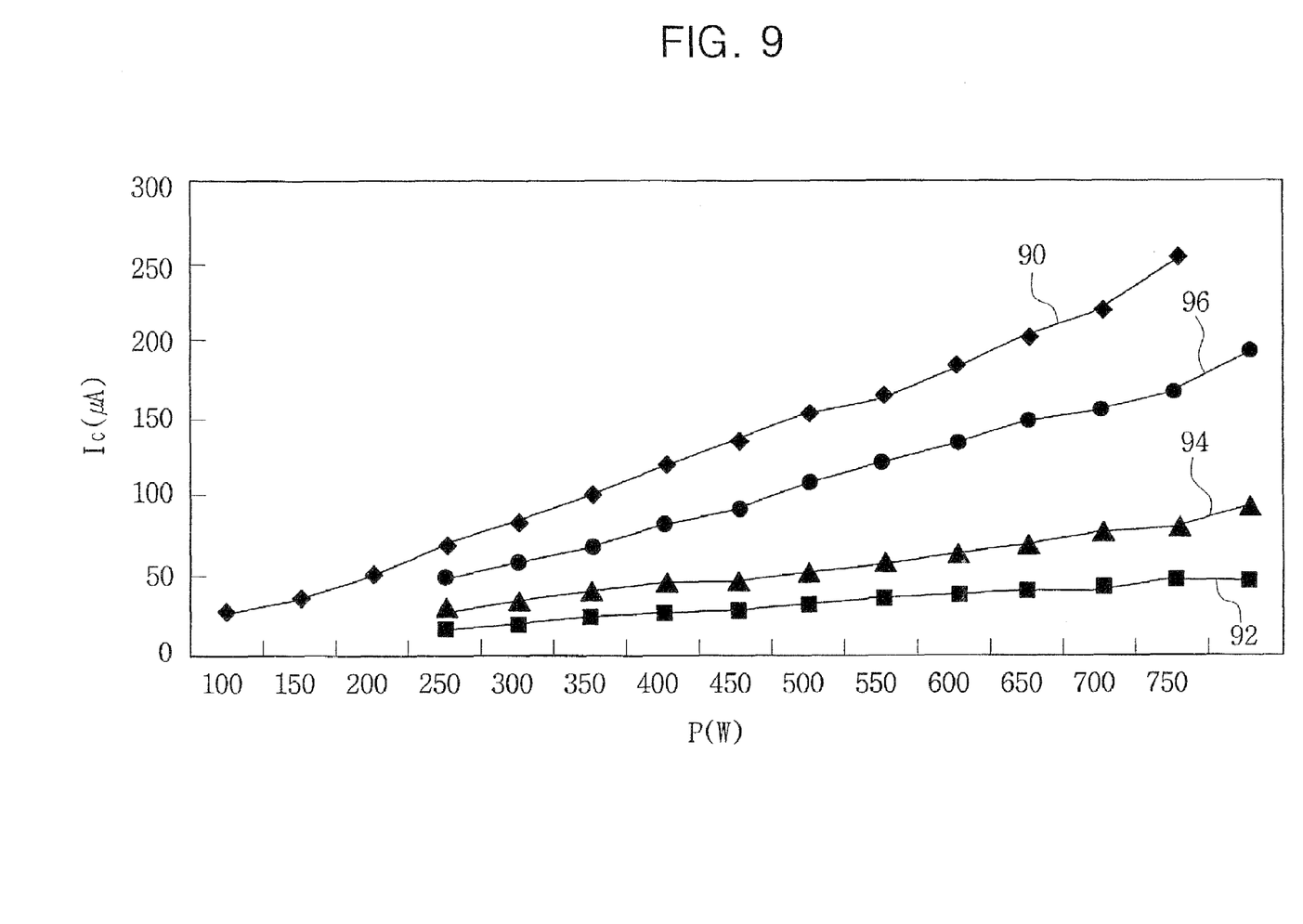
FIGS. 9 and 10 are graphs of ion current characteristics representing variation of ion beams extracted by use of the plasma sheath controller.
Figure 10:
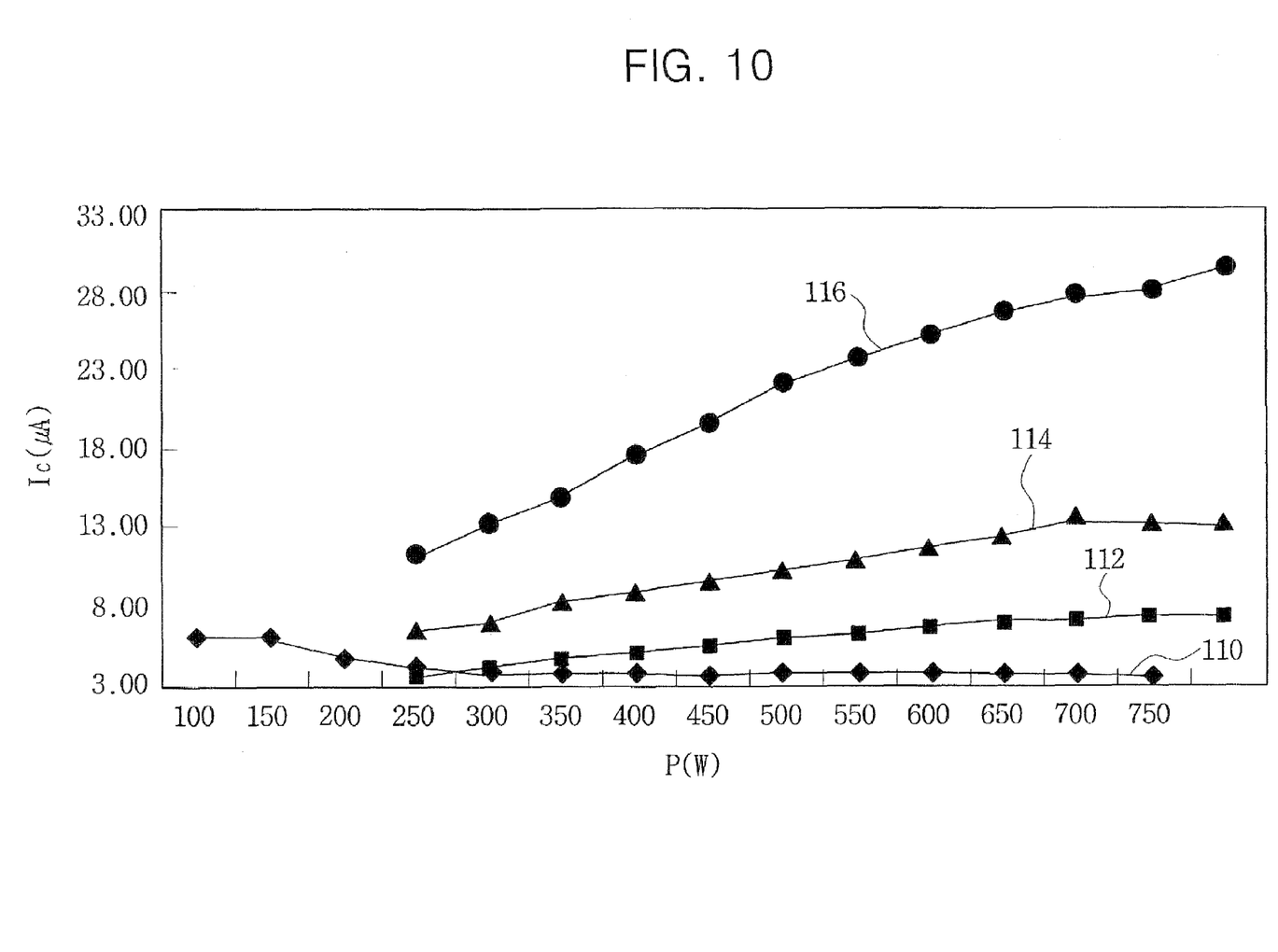

FIG. 9 illustrates ion current characteristics measured in a first ion extraction grid in order to check variation of ion beams extracted by use of a plasma sheath controller, and FIG. 10 illustrates ion current characteristics measured in a specimen chamber adjacent to a grid assembly in order to check variation of ion beams extracted by use of the plasma sheath controller. Horizontal axes P of FIGS. 9 and 10 denote radio frequency (RF) power applied to an induction coil of a plasma chamber, and the unit is watt (W). Vertical axes Ic of FIGS. 9 and 10 denote measured ion current, and the unit is micro ampere (μA).

A gas used in the experiment is argon (Ar). A grid assembly including a first ion extraction grid, a second ion extraction grid, and a third ion extraction grid was used. +150V, −100V and 0V were applied to the first ion extraction grid, the second ion extraction grid, and the third ion extraction grid, respectively. The grid assembly had first ion extraction apertures of 3.5 mm. A plasma sheath controller was attached to a surface of the first ion extraction grid. The plasma sheath controller was formed of a conductive net grid.

Referring to FIG. 9, curve 90 represents ion current characteristics measured in the first ion extraction grid when the plasma sheath controller was omitted and only the grid assembly was mounted. Curve 92 represents ion current characteristics measured in the first ion extraction grid when the plasma sheath controller having the second ion extraction apertures of 200 μm was mounted with the grid assembly. Curve 94 represents ion current characteristics measured in the first ion extraction grid when the plasma sheath controller having the second ion extraction apertures of 400 μm was mounted with the grid assembly. Curve 96 represents ion current characteristics measured in the first ion extraction grid when the plasma sheath controller having the second ion extraction apertures of 600 μm was mounted with the grid assembly.

As can be seen from curves 90, 92, 94 and 96, it will be appreciated that the ion current measured in the first ion extraction grid is increased as the RF power applied to the induction coil of the plasma chamber is increased. That is, it will be appreciated that the ion current measured in the first ion extraction grid can be increased by an increase of the density of the plasma.

In addition, it is possible to relatively reduce the ion current measured in the first ion extraction grid by mounting the plasma sheath controller. That is, the ion current measured in the first ion extraction grid may be somewhat reduced due to installation of the plasma sheath controller.

Further, the smaller the size of the second ion extraction apertures, the less the ion current measured in the first ion extraction grid. That is, the ion current measured in the first ion extraction grid may be differently detected depending on the size of the second ion extraction apertures. It will also be appreciated that the ion current measured in the first ion extraction grid may be controlled by adjusting the size of the second ion extraction apertures.

Referring to FIG. 10, curve 110 represents ion current characteristics measured in the specimen chamber when the plasma sheath controller was omitted and only the grid assembly was mounted. Curve 112 represents ion current characteristics measured in the specimen chamber when the plasma sheath controller having the second ion extraction apertures of 200 μm was mounted with the grid assembly. Curve 114 represents ion current characteristics measured in the specimen chamber when the plasma sheath controller having the second ion extraction apertures of 400 μm was mounted with the grid assembly. Curve 116 represents ion current characteristics measured in the specimen chamber when the plasma sheath controller having the second ion extraction apertures of 600 μm was mounted with the grid assembly.

In curve 110, when the plasma sheath controller was omitted and only the grid assembly was mounted, it will be appreciated that the ion current measured in the specimen chamber is somewhat reduced as the RF power is increased. It can be understood that the thickness of the plasma sheath is reduced due to increase of the plasma density and the ion flux is decreased due to dispersion of the extracted ions.

In curves 112, 114 and 116, when the plasma sheath controller was mounted with the grid assembly, it will be appreciated that the ion current measured in the specimen chamber is increased as the RF power is increased. The ion current measured in the specimen chamber may be differently detected depending on the size of the second ion extraction apertures. In addition, it will be appreciated that the ion current measured in the specimen chamber may be controlled by adjusting the size of the second ion extraction apertures.

From FIGS. 9 and 10, it will be appreciated that an ion beam apparatus with high ion flux can be implemented by increasing the plasma density and using a plasma sheath controller and a grid assembly.

As can be seen from the foregoing, an ion beam apparatus having a plasma sheath controller and a grid assembly is provided. The plasma sheath controller functions to adjust formation of a plasma sheath. That is, a plasma surface can be provided parallel to the plasma sheath controller. Therefore, it is possible to implement an ion beam apparatus with high ion flux. In addition, it is possible to implement a semiconductor manufacturing apparatus using the ion beam apparatus with high ion flux.

Exemplary embodiments of the present invention have been disclosed herein and, although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. An ion beam apparatus comprising:
   a plasma chamber;
   a grid assembly installed at one end of the plasma chamber, and having first ion extraction apertures; and
   a plasmaسheath controller disposed between the plasma chamber and the grid assembly, and having second ion extraction apertures smaller than the first ion extraction apertures.

2. The ion beam apparatus according to claim 1, wherein the second ion extraction aperture has a width smaller than a thickness of a plasma sheath of the plasma chamber.

3. The ion beam apparatus according to claim 2, wherein the plasma sheath controller apertures is several times smaller than the thickness of the plasma sheath.

4. The ion beam apparatus according to claim 1, wherein the plasma sheath controller is a conductor.

5. The ion beam apparatus according to claim 1, wherein the plasma sheath controller is a net grid.

6. The ion beam apparatus according to claim 5, wherein the plasma sheath controller is formed of one selected from the group consisting of graphite, metal, and carbon nano tubes.

7. The ion beam apparatus according to claim 1, wherein the plasma sheath controller is a porous material layer.

8. The ion beam apparatus according to claim 7, wherein the plasma sheath controller is formed of one selected from the group consisting of porous metal layer or a porous ceramic layer.

9. The ion beam apparatus according to claim 1, wherein the grid assembly comprises:
   a first ion extraction grid; and
   a second ion extraction grid,
   wherein the first ion extraction grid is interposed between the plasma sheath controller and the second ion extraction grid.

10. The ion beam apparatus according to claim 9, wherein the plasma sheath controller is thinner than the first ion extraction grid.

11. The ion beam apparatus according to claim 9, wherein the first ion extraction grid is applied with a positive voltage, and the second ion extraction grid is applied with a negative voltage or grounded.

12. The ion beam apparatus according to claim 9, wherein the grid assembly further comprises a third ion extraction grid to which a positive voltage is applied, wherein the second ion extraction grid is interposed between the first ion extraction grid and the third ion extraction grid.

13. A semiconductor manufacturing apparatus comprising:
   a plasma chamber;
   a specimen chamber in communication with the plasma chamber;
   a grid assembly disposed between the plasma chamber and the specimen chamber, and having first ion extraction apertures; and
   a plasma sheath controller disposed between the plasma chamber and the grid assembly, and having second ion extraction apertures smaller than the first ion extraction apertures.

14. The semiconductor manufacturing apparatus according to claim 13, further comprising:
   a gas inlet port disposed at one surface of the plasma chamber; and
   an exhaust port disposed in the specimen chamber.

15. The semiconductor manufacturing apparatus according to claim 13, further comprising a wafer stage disposed in the specimen chamber.

16. The semiconductor manufacturing apparatus according to claim 13, wherein the second ion extraction aperture has a width smaller than a thickness of a plasma sheath in the plasma chamber.

17. The semiconductor manufacturing apparatus according to claim 13, wherein the plasma sheath controller is in contact with the grid assembly.

18. The semiconductor manufacturing apparatus according to claim 13, wherein the plasma sheath controller is a net grid or a porous material layer.

19. The semiconductor manufacturing apparatus according to claim 18, wherein the plasma sheath controller is formed of one selected from the group consisting of graphite, metal, and carbon nano tubes.

20. The semiconductor manufacturing apparatus according to claim 13, wherein the grid assembly comprises:
   a first ion extraction grid; and
   a second ion extraction grid
   wherein the first ion extraction grid is interposed between the plasma sheath controller and the second ion extraction grid.

21. The semiconductor manufacturing apparatus according to claim 20, wherein the plasma sheath controller is thinner than the first ion extraction grid.

22. The semiconductor manufacturing apparatus according to claim 20, wherein the first ion extraction grid is applied with a positive voltage, and the second ion extraction grid is applied with a negative voltage or grounded.

23. The semiconductor manufacturing apparatus according to claim 20, wherein the grid assembly further comprises a third ion extraction grid to which a positive voltage is applied, wherein the second ion extraction grid is interposed between the first ion extraction grid and the third ion extraction grid.

24. The semiconductor manufacturing apparatus of claim 23, wherein the voltage applied to the third ion extraction grid is less than the voltage applied to the first ion extraction grid.

25. The semiconductor manufacturing apparatus of claim 13, wherein the second ion extraction apertures of the plasma sheath controller have a width of between about 200 µm and 600 µm.

26. A method for providing an ion beam from a plasma source, comprising:
   positioning a plasma sheath controller adjacent the plasma sheath of a plasma source and in front of a grid assembly so that multiple apertures of the plasma sheath controller are in communication with each aperture of the grid assembly and the resulting plasma sheath is substantially coplanar with a surface of the plasma sheath controller, wherein the width of the plasma sheath controller apertures is smaller than the thickness of the plasma sheath;
   applying a voltage to the grid assembly; and
   extracting ions through apertures in the plasma sheath controller and then through apertures in the grid assembly to form an ion beam.

27. The method of claim 26, further including:
   providing a first extraction grid of the grid assembly and a second extraction grid, aligned with the first; and
   applying the voltage to the first extraction grid and a different voltage to the second extraction grid.

28. The method of claim 27, further including:
   providing a third extraction grid of the grid assembly so that the second extraction grid is interposed between the first and third extraction grids;
   applying a first positive voltage to the first extraction grid; and
   applying a second positive voltage to the third extraction grid lower than the first positive voltage.

* * * * *

UNITED STATES PATENT AND TRADEMARK OFFICE
CERTIFICATE OF CORRECTION

PATENT NO. : 7,564,042 B2 Page 1 of 1
APPLICATION NO. : 11/834561
DATED : July 21, 2009
INVENTOR(S) : Do-Haing Lee et al.

It is certified that error appears in the above-identified patent and that said Letters Patent is hereby corrected as shown below:

Column 12, line 2, the word "grid" should read -- grid, --.

Signed and Sealed this

Seventeenth Day of November, 2009

David J. Kappos
*Director of the United States Patent and Trademark Office*